US005496450A

United States Patent [19]

Blumenthal et al.

[11] Patent Number: 5,496,450

[45] Date of Patent: Mar. 5, 1996

[54] MULTIPLE ON-LINE SENSOR SYSTEMS AND METHODS

[76] Inventors: Robert N. Blumenthal, 17470 Broad Ct., Brookfield, Wis. 53005; Andreas T. Melville, 204 N. 86th St., Milwaukee, Wis. 53226

[21] Appl. No.: 227,308

[22] Filed: Apr. 13, 1994

[51] Int. Cl.[6] .......... G01N 27/26; G01R 31/08; F23N 5/00

[52] U.S. Cl. .......... 205/782; 204/401; 204/406; 204/408; 204/427; 204/428; 204/400; 324/512; 324/522; 324/537; 324/754; 324/755; 324/759; 324/760; 324/763; 324/555; 110/185; 205/784

[58] Field of Search .......... 204/401, 406, 204/408, 427, 428, 400, 153.1, 153.16; 110/185, 190; 324/512, 522, 537, 754, 755, 759, 760, 763, 555

[56] References Cited

U.S. PATENT DOCUMENTS

| | | | |
|---|---|---|---|
| 3,938,075 | 2/1976 | Reddy | 340/52 R |
| 3,948,228 | 4/1976 | Luchaco | 123/32 EA |
| 4,337,516 | 6/1982 | Murphy et al. | 364/551 |
| 4,381,075 | 4/1983 | Cargill et al. | 237/8 R |
| 4,672,997 | 6/1987 | Landis et al. | 137/554 |
| 4,736,320 | 4/1988 | Bristol | 364/300 |
| 4,744,246 | 5/1988 | Busta | 73/204 |
| 5,273,640 | 12/1993 | Kusanagi et al. | 204/401 |

OTHER PUBLICATIONS

Product Manual; Honeywell; UDC 5000 Ultra–Pro Universal Digital Controller Product Manual; 51–51–25–17c; Mar. 1993.

Types of Heat–Treating Furnaces; Smith, Holcroft, A Division of Thermo Process Systems, Inc.; Heat–Treating Equipment; pp. 465–474 no month or year available.

Check Out Carbon Control System Step By Step; Blumenthal et al; Furnace Control Corp; Aug. 1991.

*Primary Examiner*—Bruce F. Bell
*Attorney, Agent, or Firm*—Ryan, Maki & Hohenfeldt

[57] ABSTRACT

A control device and associated methodology select from at least two on-line sensors to assure an accurate and reliable feedback input to control the heat treating conditions within a furnace. The device and methodology also serve to provide an "alert" or "early warning" of gradual degradation of sensor performance, before ongoing heat treating operations are adversely affected.

30 Claims, 11 Drawing Sheets

MULTIPLE ON-LINE SENSOR SYSTEMS AND METHODS

FIELD OF THE INVENTION

This invention relates generally to the monitoring and/or control of atmospheres within heat treating furnaces.

BACKGROUND OF THE INVENTION

Probes called "oxygen sensors" are commonly used to measure the oxygen content of gases in a heat treating furnace. Blumenthal U.S. Pat. No. 4,588,493, entitled "Hot Gas Measuring Probe," describes probes that can be used for this purpose.

The probe is typically installed in the heat treating furnace in direct contact with the hot atmosphere used for heat treating. The probe includes a solid electrolyte. One side of the electrolyte contacts the hot furnace atmosphere to be measured. The other side of the electrolyte contacts a reference gas, whose oxygen content is known. A voltage (measured in millivolts) is generated between the two sides of the electrolyte.

The magnitude of this voltage E(mv) is related to temperature and the difference between the oxygen content in the measured atmosphere and the oxygen content in the reference gas, as expressed in the following formula:

$$E(mv) = 0.0496T(°K) \times \log \frac{P_{O2}(Ref)}{P_{O2}}$$

Since the oxygen content of the reference gas [$P_{O2}$ (Ref)] is known, one can therefore determine the oxygen content of the furnace atmosphere [$P_{O2}$] by measuring the probe voltage [E(mv)] and the temperature T(°K).

The probe voltage is usually measured by an associated controller outside the furnace. The controller compares the measured voltage to a "set point" voltage. The controller drives valves to alter the mixture of gases forming the atmosphere to maintain the desired oxygen content within the furnace.

The probe typically has associated with it a thermocouple. The thermocouple is located within the furnace to measure the temperature of the heat treating atmosphere. The thermocouple generates a voltage (also measured in millivolts) that represents the temperature conditions within the furnace.

This voltage signal representing the temperature conditions measured by the thermocouple may also be processed by the controller. By using the measured temperature and probe voltages, the controller generates a process variable (PV) expressing conditions within the furnace directly in percent oxygen ($O_2$), dew point, or in percent carbon.

Maintaining the desired oxygen content in a carrier gas at some specific temperature within the furnace controls the heat treating atmosphere. *Metals Handbook*, Vol. 4, pp. 417–431 (9th Edition 1981) contains a further discussion of atmosphere control in a heat treating furnace.

Accurate control of carbon potential in the heat treating industry requires accurate input from both the thermocouples and the oxygen sensor probes. When a probe or thermocouple unexpectedly fails, or if its performance declines during use, the results can be economically catastrophic. Without accurately functioning sensor probes, the carbon potential within the furnace can no longer be reliably controlled. The heat treating process may have to be suspended while the faulty probe or thermocouple is replaced. The load of metal parts undergoing heat treatment within the furnace at the time of failure also may have to be scrapped or reworked. If the metal parts are expensive (for example, the landing gear of an airplane), the economic loss can be tremendous.

Even without massive probe failure, the accuracy of a probe can be adversely affected by gradual degradation in performance over time. There are also process-related problems adversely affecting probe accuracy. Soot can build up on the probe exposed to the harsh atmosphere in the furnace. Soot buildup degrades the performance and the accuracy of the probe. Chemical contaminants can also coat or deteriorate the electrolyte surface and cause inaccurate probe readings.

The accuracy of a thermocouple can be manually checked by comparing its output with a thermocouple traceable to the National Institute of Standards and Technology, following ASTM 2750. See Blumenthal et al, "Check Out Carbon Control System Step by Step," *Heat Treating*, August 1991. This manual procedure is well established and is followed in the heat treating industry.

However, the procedure for periodically checking the accuracy of oxygen sensor probes is not as well understood and established. One suggested way is to perform a weight-gain measurement of an equilibrated steel shim. See, e.g., Blumenthal el al., Ibid. This steel shim procedure, like the thermocouple procedure, is done manually and can be laborious.

There are other probe test methods that check specific components of the probe, like the outer electrode, but not the overall performance or accuracy of the probe. These specific test methods can lead to a false sense of security. Component-specific tests may overlook or fail to detect degradation in probe performance or accuracy caused by other probe components that are not checked.

The different, more subtle failure modes of today's high quality oxygen probes are not widely appreciated. The onset of operation that foretells future probe failure often goes undetected, because it is illusive to detect using today's methodologies. As a result, probe failure, or the accumulation of soot, can occur without apparent warning.

Despite all reasonable precautions, conventional furnace control systems remain subject to costly process disruption due to the sudden failure or undetected gradual decline of performance and accuracy of probes and thermocouples.

SUMMARY OF THE INVENTION

This invention has as one principal objective the realization of accurate and reliable carbon potential control in heat treating furnaces.

This aspect of the invention provides a device and related method that automatically control the selection of signal inputs from at least two probes positioned to simultaneously sense the atmosphere of a heat treating furnace. The device and method make electrical connection with the probes to receive input signals independently from each probe. According to this aspect of the invention, the magnitudes of the input signals are related to the oxygen content of the furnace atmosphere.

The device and method compare the magnitudes of the received input signals from each probe and select one probe as a control probe based upon this comparison. The device and method transmit as control outputs the received input signals from only the one selected control probe.

In a preferred embodiment, the device and method periodically compare the magnitudes of the received input signals of each probe and select as the control probe the probe providing the largest input signal magnitude. In this way, the device and method purposefully select as the control probe the one whose signal levels best assure reliable and accurate furnace control during the heat treatment period.

This aspect of the invention makes possible a heat treating system comprising multiple oxygen sensing probes positioned to simultaneously sense the atmosphere supplied to a heat treating furnace. The system includes an interface for controlling the selection of the input signals from the multiple probes. The interface includes an input element electrically coupled to the probes to receive input signals independently from each probe. A processing element electrically connected to the input element compares the magnitude of the received input signals from each probe and selects one probe as a control probe based upon the comparison. An output element electrically connected to the input element is responsive to the processing element to transmit as control outputs the received input signals from only the one selected control probe. The system further includes a controller electrically coupled to the source of atmosphere for the furnace. The controller receives the control outputs from the interface and governs the operation of the source to create and maintain a preselected atmosphere in the furnace.

The invention has as another principal objective the realization of on-line diagnosis of the performance of probes used in association with heat treating furnaces. The on-line diagnosis detects declines in the performance and accuracy before outright failure occurs.

This aspect of the invention provides a device and associated method that monitor signal inputs from at least two probes positioned to simultaneously sense the atmosphere of a heat treating furnace. The device and method receive input signals independently from each probe, the input signals being related to the atmosphere of the furnace. The device and method perform a first comparison of the received input signals from each probe and select one probe as a control probe and one probe as a standby probe based upon the first comparison. The device and method also performing a second comparison of the received input signals from the selected standby probe and the selected control probe and generate a diagnostic output when the second comparison fails to meet prescribed criteria.

In a preferred embodiment, the device and method perform the second comparison by comparing the magnitudes of the received input signals from the standby probe and control probe to generate the diagnostic output when the difference in the magnitudes fails to meet prescribed criteria. In one implementation, the device and method integrate the differences in the magnitudes over a prescribed time period to generate the diagnostic output when the integral of the differences exceeds a prescribed amount. In another implementation, the device and method derive a running average of the differences in the magnitudes over the prescribed time period to generate the diagnostic output when the running average of the differences exceeds a prescribed amount.

In a preferred embodiment, the diagnostic output prompts the operator to replace the selected standby probe. Furthermore, in this embodiment, the diagnostic output prevents subsequent selection of the standby probe as the control probe, regardless of the first comparison.

According to this aspect of the invention, the diagnostic output warns the operator when degradation in standby probe performance is first sensed, before failure occurs. The diagnostic output prompts the operator to take corrective action, before the degradation reaches a stage where the standby probe can no longer be relied upon. The diagnostic output can also foretell, at an early stage, process-related problems, before these problems adversely affect the accuracy and reliability of the probe control signals.

This aspect of the invention makes possible a heat treating system comprising multiple oxygen sensing probes positioned to simultaneously sense the atmosphere supplied to a heat treating furnace. The system includes an interface for monitoring the input signals from the multiple probes. The interface has an input element electrically coupled to the probes to receive input signals independently from each probe. A processing element electrically connected to the input element compares the received input signals from each probe and generates a diagnostic output when the comparison fails to meet prescribed criteria.

Combining the various on-line control and diagnosis aspects of the invention provides a device, method, and system that automatically select an appropriate control probe to maximize accuracy of feedback input to the furnace controller, as well as automatically issue an "early warning" of pre-failure degradation of standby probe performance.

The automatic selection and diagnostic outputs can eliminate the need for periodic manual probe inspections. The on-line outputs serve to free the operator from worry about sudden, economically catastrophic failures.

Other features and advantages of the inventions are set forth in the following Description and Drawings, as well as in the appended claims.

The invention may be embodied in several forms without departing from its spirit or essential characteristics. The scope of the invention is defined in the appended claims, rather than in the specific description preceding them. All embodiments that fall within the meaning and range of equivalency of the claims are therefore intended to be embraced by the claims.

DESCRIPTION OF THE PREFERRED EMBODIMENTS

Figure 1:
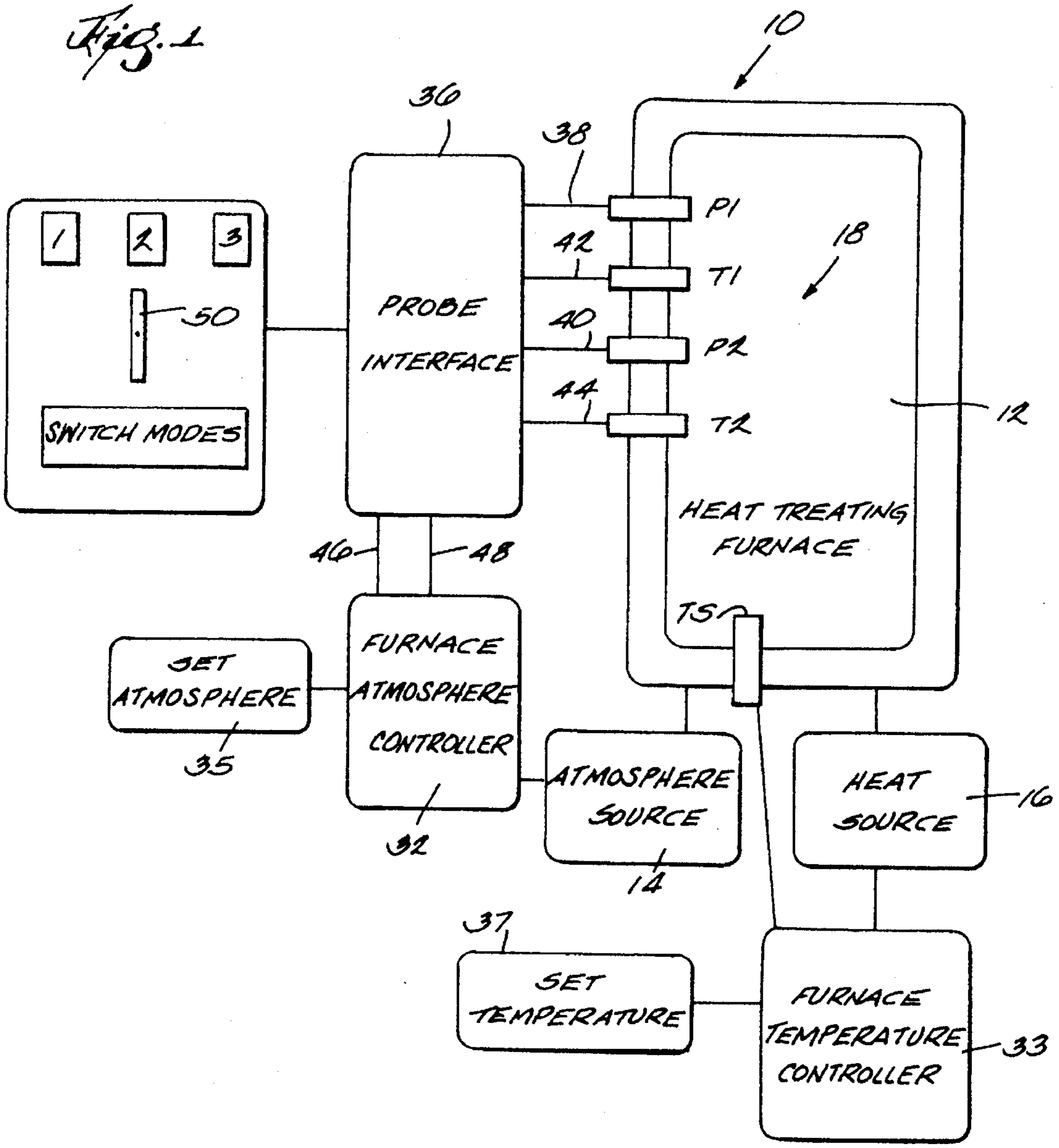
FIG. 1 is a diagrammatic view of a multiple sensor control system for a heat treating furnace that embodies the features of the invention.

FIG. 1 shows a system 10 for controlling the atmosphere of a heat treating furnace 12.

The furnace 12 includes a source 14 of the desired heat treating atmosphere, which is conveyed into the furnace 12. The furnace 12 also includes a source 16 of heat for the furnace 12. The source 16 heats the interior of the furnace 12, and thus the heat treating atmosphere itself, to high temperatures. The heated atmosphere reacts with metal parts within the furnace 12.

FIG. 1 shows the furnace 12 to be a conventional type. Alternatively, the furnace 12 can comprise a conventional rotary retort type carburizing furnace, like that shown in Schneider U.S. Pat. No. 4,966,348. The furnace can also comprise a conventional endothermic generator, like that shown in Blumenthal et al. application Ser. No. 07/800,607, filed Nov. 27, 1991. The furnace 12 can also be one of the various alternative types of furnaces shown in "ASM Handbook (Heat Treating)," Volume 4, pages 465–474, published by ASM International (1991).

The system 10 includes multiple on-line sensors 18. The sensors 18 are positioned to simultaneously sense actual heat treating conditions within the furnace 12. Usually, the sensors 18 are located in the furnace, as FIG. 1 shows. The sensors 18 can also be remotely located, as the above-identified Schneider '348 Patent and Blumenthal et al. '607 application show.

In the illustrated and preferred embodiment, the multiple sensors 18 independently sense atmosphere and temperature conditions within the furnace 12. The sensors 18 generate signals that are used in a feedback loop to maintain desired atmosphere conditions in the furnace 12.

I. THE SENSORS

In the illustrated and preferred embodiment, the sensors 18 includes probes P1 and P2 (also called "oxygen sensors") of the type described in U.S. Pat. No. 4,588,493 ("the '493 patent"), entitled "Hot Gas Measuring Probe." The '493 patent is incorporated into this Specification by reference. Of course, probes of other constructions can be used in accordance with the invention.

Figure 2:
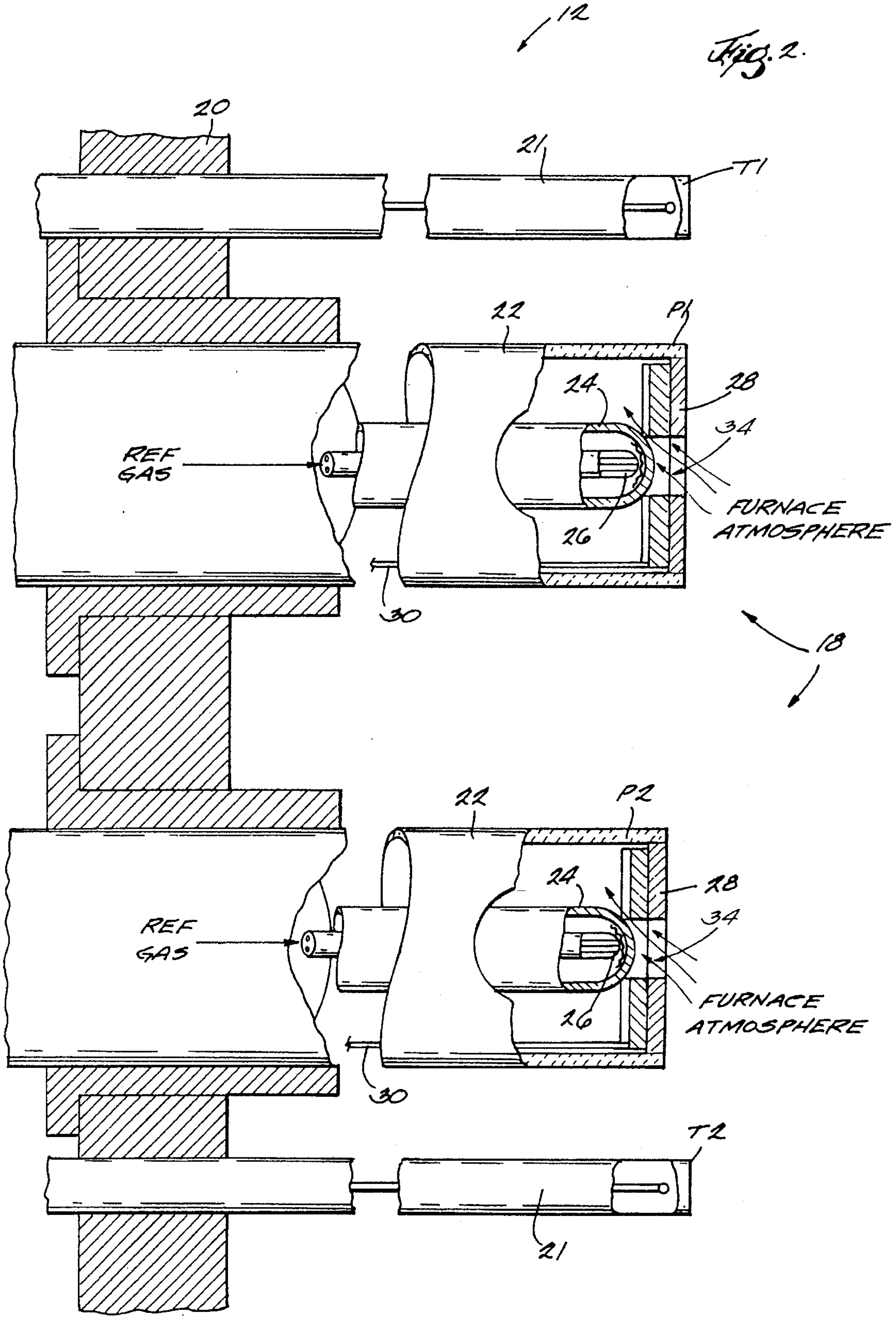
FIG. 2 is an enlarged side view, with parts broken away and in section, of the sensors associated with the system shown in FIG. 1.

As FIG. 2 shows, the probes P1 and P2 are installed through the furnace wall 20 into the furnace 12.

In the illustrated orientation, the right ends of the probes P1 and P2 are located within the furnace 12 near each other. They are thereby exposed to the generally same heated atmosphere, albeit not necessarily in the same region of the furnace 12.

As FIG. 2 shows, each probe P1 and P2 includes an outer sheath 22. The sheath 22 encloses within it an electrode assembly comprising a solid electrolyte 24 and two electrodes 26 and 28.

The first electrode 26 is placed in contact with the inside of the electrolyte 24. The second electrode 28, which also serves as an end plate of the sheath 22, is placed in contact with the outside of the electrolyte 24. The two electrodes are electrically connected to lead wires 30, which run through the sheath 22 and through the furnace wall 20 to a probe interface 36, which will be described later.

As FIG. 2 shows, a reference gas occupies the region where the inside of the electrolyte 24 contacts the first (or inner) electrode 26. The furnace atmosphere circulates in the region where the outside of the electrolyte 24 contacts the second (or outer) electrode 28. The furnace atmosphere circulates past the point of contact through adjacent apertures 34.

When the electrolyte 24 is placed in opposing contact with the reference gas and the furnace atmosphere, a voltage (measured in millivolts, or mv) is generated between the electrodes 26 and 28. The magnitude of this voltage is related to the temperature and the difference between the oxygen content in the furnace atmosphere and the oxygen content in the reference gas. Since the oxygen content of the reference gas is known, the oxygen content of the furnace atmosphere can be determined by measuring this voltage and temperature.

This signal will be called "the mv-oxygen signal." Each probe P1 and P2 independently provides its own mv-oxygen signal input.

It should be appreciated that other types of oxygen sensing probes can be used. Still, regardless of the type of sensing probe used, it is preferred that the probes P1 and P2 be of the same construction and from the same manufacturer and have reproducible performance characteristics. The probes P1 and P2 thus predictably operate in essentially the same way, and one can expect that the mv-oxygen signals they generate will be comparable. The use of probes P1 and P2 of mutually different construction and operation in the system 10 is not recommended, because inherent structural or operational differences may lead to the generation of incompatible mv-oxygen signals and inaccurate control results.

As FIG. 2 also shows, an outer tube 21 also carries another sensor 18 in the form of a thermocouple (designated T1 and T2). The thermocouples T1 and T2 are located near the associated probe P1 and P2. Alternatively, the thermocouples T1 and T2 can be carried within the probes P1 and P2.

Each thermocouple T1 and T2 independently conveys its own voltage readings (also measured in mv). These voltage readings represent the temperature conditions within the furnace 12 where the thermocouples T1 and T2 are located. This signal will be called "the mv-temperature signal." As with the probes P1 and P2, the thermocouples T1 and T2 are preferably of the same general construction to provide comparable input signals.

It is believed that the use of two probes P1 and P2 in association with the system will result in substantial improvements in accuracy and detection of pre-failure conditions. Still, when the nature of the heat treating operations demands more stringent control of conditions within the furnace, with substantially no tolerance for variances and sudden probe failure, the system can employ more than two probes for greater redundancy and assurance of fail safe operations.

II. THE FEEDBACK CONTROL SYSTEM

As FIG. 1 shows, the system 10 includes a sensor interface module 36 and a furnace atmosphere controller 32.

The interface module 36 is electrically coupled in parallel to the probes P1/P2 and thermocouples T1/T2. The furnace atmosphere controller 32 is electrically coupled in series to the atmosphere source 14.

Four parallel input leads 38/40/42/44 convey the mv-oxygen and mv-temperature signals from the probes P1/P2 and thermocouples T1/T2 to the interface module 36. Two parallel output leads 46 and 48 convey, respectively, one selected mv-oxygen signal and one selected mv-temperature signal to the furnace atmosphere controller 32. The interface module 36 serves to select a single mv-oxygen signal and a single mv-temperature signal from the multiple parallel inputs 38/40/42/44.

The furnace atmosphere controller 32 processes the single mv-oxygen signal output and the single mv-temperature signal output of the interface module 36. The controller 32 compares the measured PV values to desired values set by the operator (using input device 35). The furnace atmosphere controller 32 generates command signals based upon the comparison to adjust the mixture of gases provided by the source 14 to the furnace 12.

In this way, the interface module 36 and controller 32 work together to maintain prescribed atmosphere conditions within the furnace 12. It should be appreciated that the module 36 and controller 32 can be incorporated into a single, integrated control system.

An additional thermocouple TS installed in the furnace 12 is electrically coupled to a furnace temperature controller 33. The furnace temperature controller 33 is coupled in series to the heat source 16. The furnace temperature controller 33 compares the temperature sensed by the thermocouple TS to a desired value set by the operator (using input device 37). The furnace temperature controller 33 generates command signals based upon the comparison to adjust the amount of heat energy provided by the source 16 to the furnace 12.

A. THE INTERFACE MODULE

In the illustrated and preferred embodiment (see FIG. 1), the interface module 36 is operated in at least three modes, using a manual selection switch 50.

The three Modes are:

(i) Mode 1 (Switch Position 1): The operator selects to convey only the mv-oxygen signal of the first probe P1 and only the mv-temperature signal of the first thermocouple T1 through the interface module 36 to the furnace controller 32.

(ii) Mode 2 (Switch Position 2): The operator selects to convey only the mv-oxygen signal of the second probe P2 and only the mv-temperature signal of the second thermocouple T2 through the interface module 36 to the furnace controller 32.

(iii) Mode 3 (Switch Position 3): The operator allows the interface module 36 itself to automatically select either the probe P1 or P2 and, if desired, either the thermocouples T1 or T2, to provide the mv-oxygen signal and mv-temperature signal to the furnace atmosphere controller 32.

Figure 3:
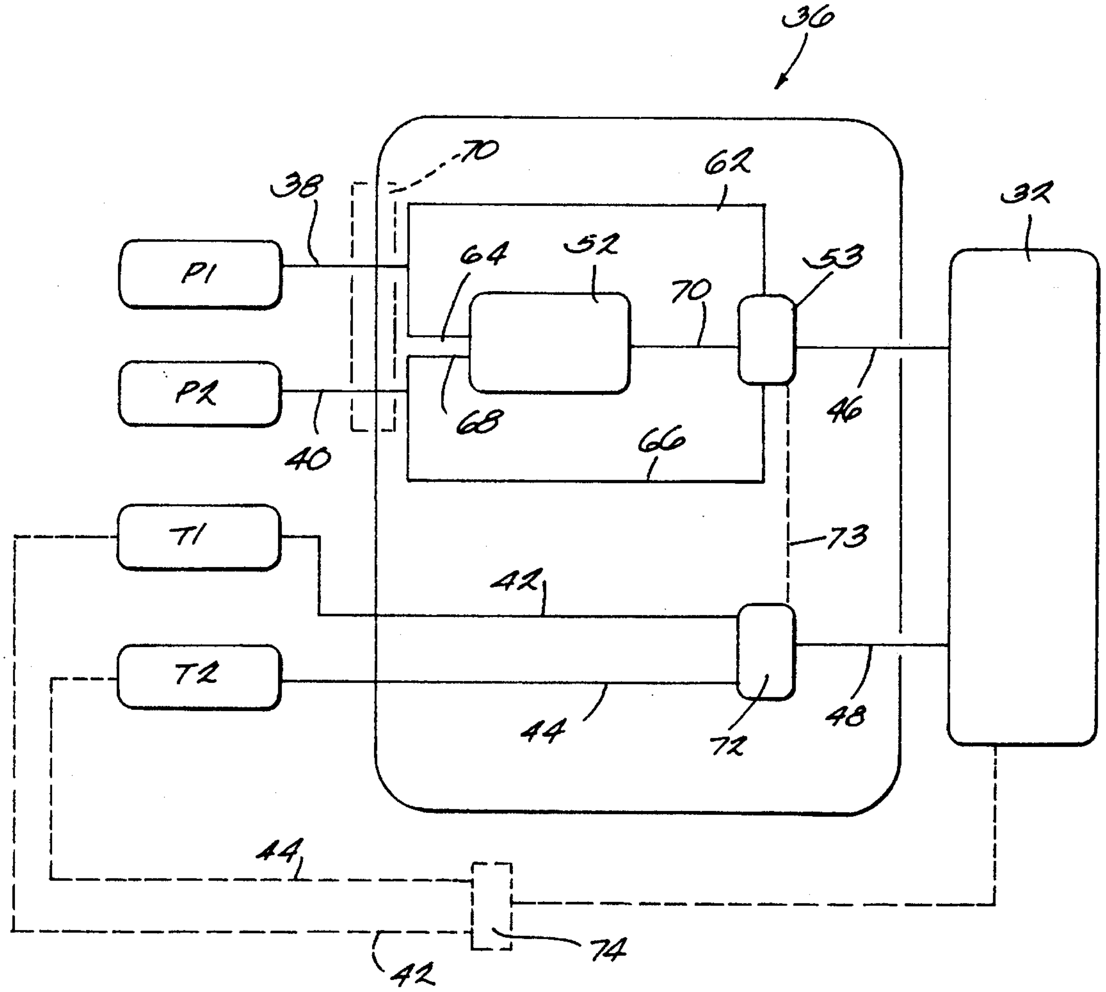
FIG. 3 is a schematic view of the interface module associated with the system shown in FIG. 1.

FIG. 3 diagrammatically shows the processing system 52 that is activated when the operator selects Mode 3. The interface module 36 includes an internal signal processing system 52 and a probe control switch element 53.

The inputs 38 and 40 from, respectively, the probe P1 and probe P2 are connected in parallel to the processing system 52 and the control switch element 53. If desired, inputs 38 and 40 can be filtered by filter 90 to reduce background noise levels.

One branch line 62 electrically connects the probe P1 input 38 with the switch element 53, while another branch line 64 electrically connects the probe P1 input 38 with the processing system 52. Likewise, one branch line 66 electrically connects the probe P2 input 40 with the switch element 53, while another branch line 68 electrically connects the probe P2 input 40 with the processing system 52. The switch output line 46 leads to the furnace controller 32.

The processing system 52 is electrically connected by a control line 70 to the switch element 53. Based upon prescribed criteria, the processing system 52 operates the switch 53 to select as output in the line 46, either the input of probe P1 or the input of probe P2.

As FIG. 3 shows, the switch element 53 directly passes through output line 46 the input signal of the selected probe P1 or P2. As a result, the output 46 of the interface 36 is substantially identical to the input of the selected probe P1 or P2, except for noise filtering.

Thus, the operation of the interface module 36 is essentially "invisible" to the furnace atmosphere controller 32. The controller 32 receives a single probe input signal, as if there is only a single on-line probe, even though there are actually two or more on-line probes simultaneously sensing the atmosphere in furnace 12.

The selection of the thermocouple T1 or T2 to provide the mv-thermocouple signals to the furnace controller 32 can vary.

As FIG. 3 shows, the interface 36 includes a thermocouple switch element 72. The switch element 72 selects between the input 42 of the first thermocouple T1 and input 44 of the second thermocouple T2. The switch element 72 sends the selected input through the output line 48 to the furnace atmosphere controller 32. As with the probes P1 and P2, the thermocouple output 48 of the interface 36 is substantially identical to the input of the selected thermocouple T1 or T2. The thermocouple selection function of the interface module 36 is thereby also "invisible" to the furnace atmosphere controller 32. The controller 32 receives a single thermocouple input signal, as if there is a single on-line thermocouple, even though there are actually two on-line thermocouples simultaneously monitoring the temperature conditions in the furnace 12.

In the arrangement shown in FIG. 3, the interface 36 slaves by control line 73 the position of the thermocouple switch element 72 to the position of the probe switch element 53. Thus, when the first probe P1 is selected by the switch element 53, the switch element 72 automatically selects the first thermocouple T1 for output to the controller 32. Likewise, when the second probe P2 is selected by the switch element 53, the second thermocouple T2 is automatically selected by the switch element 72 for output to the controller 32.

Alternatively, the switching element 72 can serve to send the thermocouple inputs in parallel through the output line 48 to the controller 32, independent of the operation of the probe switch element 53. In this circumstance, the output line 48 carries an average of the two thermocouple mv-temperature signals.

As shown in phantom lines in FIG. 3, the selection of the thermocouple T1 or T2 can also be made by the operator using an external manual selection switch 74, which altogether bypasses the interface 36. As with the internal switch element 72, the switching element 74 can either send the mv-temperature input of one selected thermocouple T1 or T2 or send an average of the two thermocouple mv-temperature signals.

In this arrangement, the interface 36 serves to control the selection of only probes P1/P2 used to sense furnace atmosphere.

The interface module 36 preferably includes a visual display (not shown) indicating to the operator which Mode 1, 2, or 3 has been selected. The display also preferably shows which probe P1/P2 and which thermocouple T1/T2 is selected to control the atmosphere conditions within the furnace.

(i) The Processing System

Figure 4:
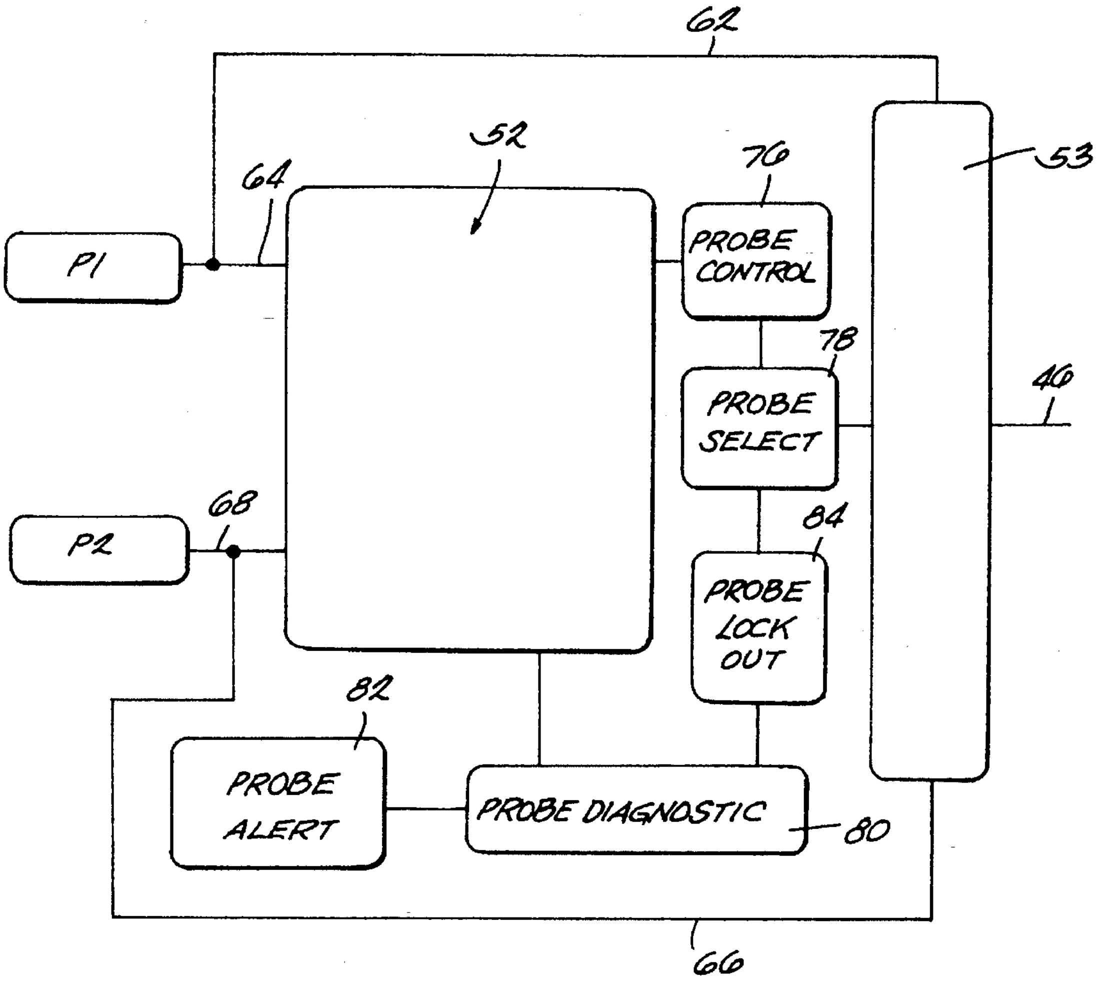
FIG. 4 is a schematic view of a preferred implementation of the processing system associated with the interface shown in FIG. 3.

As FIG. 4 shows, the processing system 52 simultaneously receives the input signals of both probes P1 and P2, through lines 64 and 68.

Based upon a first set of prescribed processing criteria, the system 52 generates probe control outputs 76. The outputs 76 generate a select signal 78 to position the switch element 53. In this way, the switch element 53 selects one probe P1/P2 to provide the single mv-signal input through output line 46 to the furnace controller 32.

According to the invention, the control outputs 76 aim to select the probe P1/P2 whose present performance is likely to be the most accurate, based upon analyzing past performance information.

The selected probe P1/P2 will be called the "control probe." The other probe P1/P2 will be called and the "standby probe."

Based upon a second set of prescribed processing criteria, the processing system 52 also generates diagnostic outputs 80 for the probes P1/P2.

As FIG. 4 shows, the diagnostic outputs 80 generate an alert signal 82 to warn the operator when pre-failure degradation in the performance of the standby probe occurs. The alert signal 82 prompts the operator to take a corrective course of action by replacing the standby probe with a new probe. By alerting the operator when the performance of the standby probe declines, the diagnostic outputs 80 assure that the system 10 is not left without a reliable standby probe, should the performance of the control probe itself degrade or fail. The diagnostic outputs 80 assure that the system 10 operates in a true control probe/standby probe condition at all times.

As FIG. 4 also shows, in the preferred implementation, the diagnostic outputs also generate a lock out signal 84. The lock out signal positions the switch element 53 to lock out the degrading probe. The lock out signal 84 overrides the probe select signal 78. Once generated, the lock out signal 84 makes it impossible to select the degrading probe as the control probe in response to any subsequent control output 76, until the processing system 52 is reset.

The processing system 52 can also detect at an early stage process-related problems, not directly related to structural failure of the probe P1/P2 or thermocouple T1/T2 itself. For example, the same criteria used to generate the diagnostic outputs 80 will also sense when sooting at the interface of the electrolyte 24 and outer electrode 28 occurs. When sooting adversely affects the performance of one probe more than the other, sooting will initially cause a pre-failure mode decline in probe performance, which the system 52 will detect and alert the operator to remedy.

The processing system 52 can be constructed in various ways. It can comprise, for example, a pre-arranged assembly of analog, mechanical-electrical switching components.

Figure 5:
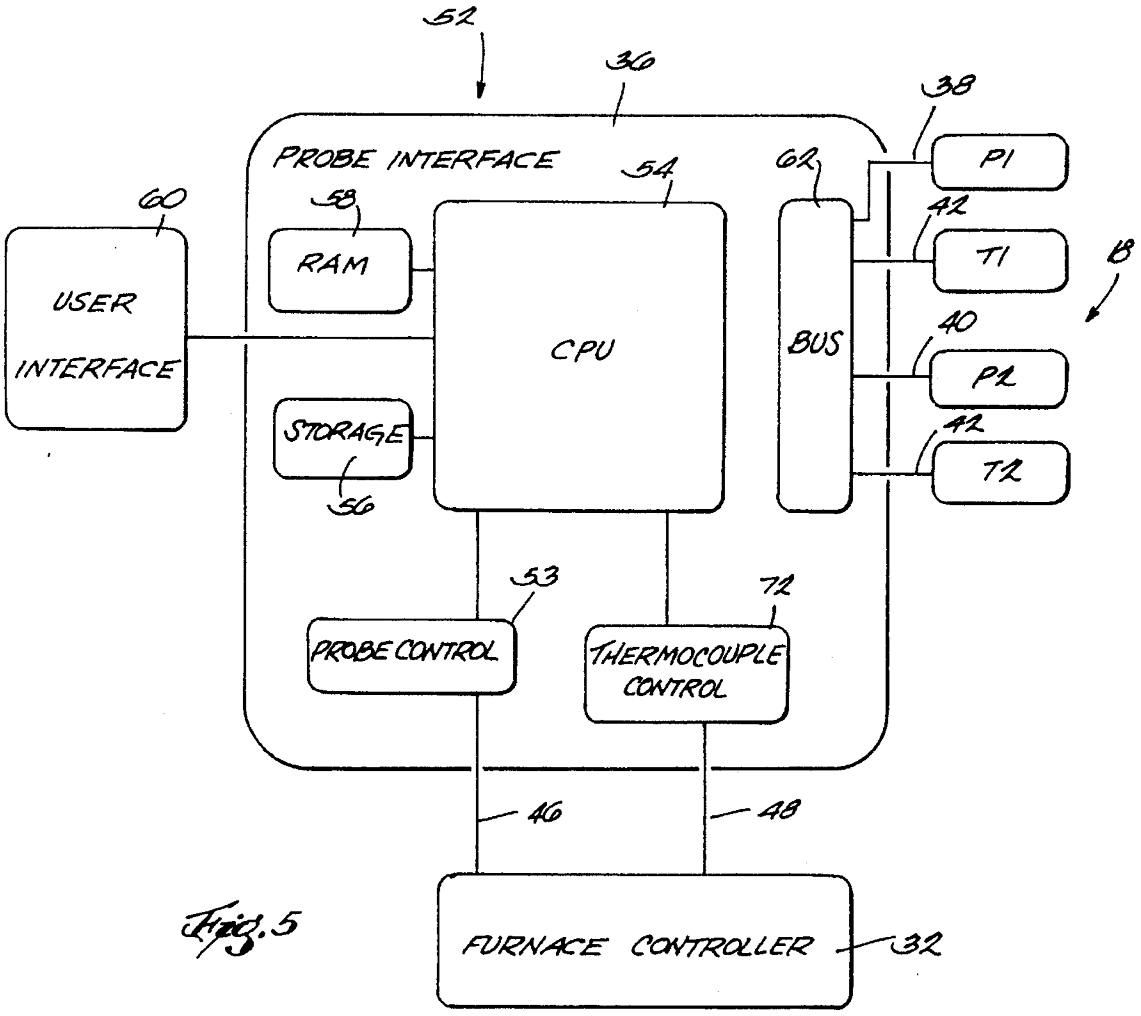
FIG. 5 is a diagrammatic view of the component parts of a preferred interface processing system shown in FIG. 4.

In the illustrated and preferred embodiment (see FIG. 5), the processing system 52 comprises a programmable central processing unit (CPU) 54. The CPU 54 communicates with a mass storage device 56 (i.e., a hard drive), where the implementation algorithms for the processing system 52 are retained. The CPU 54 also preferable includes a static RAM block 58, where the implementing algorithms are executed. The probes P1 and P2 and the thermocouples T1 and T2 communicate with the CPU 54 through a conventional bus 62. The CPU output controls the operation of switches 53 and 72, which take the form of microswitches.

An interactive operator interface 60 also preferably communicates with the CPU 54. The interactive interface 60 includes an input device (for example, a key board or mouse) for the operator to enter processing information, as will be described in greater detail later. The interface 60 also includes one or more output display devices for presenting processing results in a format the operator can understand; for example, a graphics display monitor or CRT, printer, or strip charts.

(a) The Control Outputs

Probes that are able to provide sustained, relatively high mv-oxygen signal levels throughout their service life are also the probes that provide the most accurate and reliable data for furnace control purposes. For this reason, the preferred implementation of the processing system 52(1) (see FIG. 6A) generates probe control outputs that aim to sustain as high as possible mv-oxygen signal levels over the heat treatment cycle.

Figure 6A:
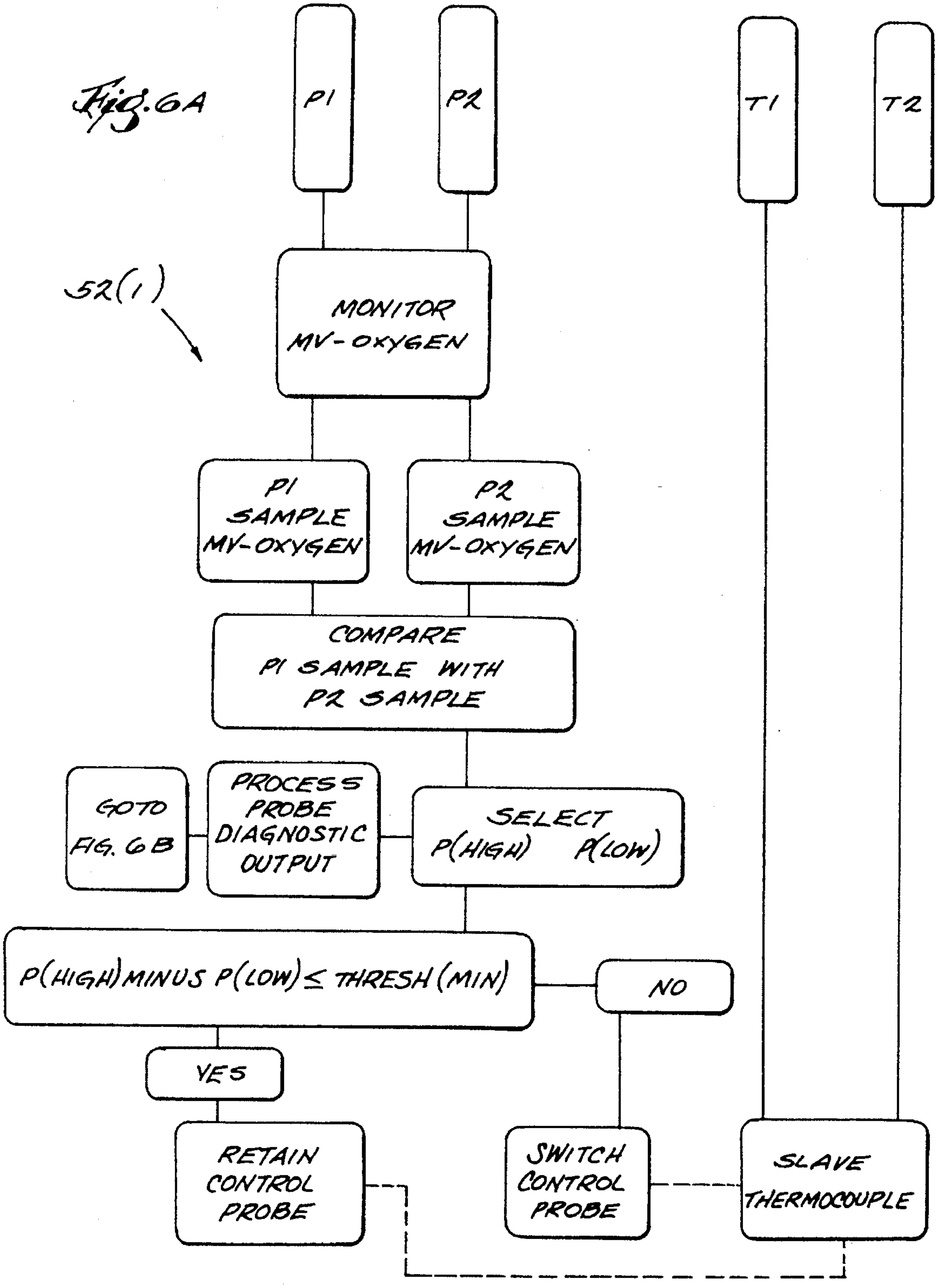
FIG. 6A is a flow chart showing the generation of sensor control outputs in a preferred implementation of an interface processing system that embodies the features of the invention.

In the implementation shown in FIG. 6A, the selection of the thermocouple is slaved to the selection of the control probe, as previously described. Still, other thermocouple selection methods could be used, as previously described.

In this embodiment, an initial probe selection is made at the beginning of a given heat treatment cycle of the control probe and the standby probe. The initial selection can be accomplished in various alternative ways.

The selection can be made arbitrarily at the start of a processing period, either by the operator or by the processing system 52(1) itself. Alternatively, the selection can be purposefully made based upon past probe performance data, either by the operator or the processing system 52(1). The selection would take into consideration, for example, the service life and/or the mv-signal inputs of the probes P1 and P2 during the last processing period.

The aim of this initial selection is to begin the heat treatment procedure with an accurate control probe. The selection of the probe having the lesser service life or historically providing the higher mv-oxygen signals achieves this initial objection.

During the heat treatment cycle, the control and standby probes P1 and P2 and the thermocouples T1 and T2 are operated on-line to sample simultaneously the atmosphere and temperature conditions within the furnace 12. Their inputs are fed in parallel through the bus 62 to the interface module 36 for analysis by the processing system 52(1). The processing system 52(1) passes the mv-oxygen input signals of only the selected control probe and the mv-temperature input signals of only the slave-selected thermocouple to the furnace controller 32.

During the heat treatment cycle, the processing system 52(1) also periodically samples the mv-oxygen input signals individually for both the control probe and the standby probe. The processing system 52(1) compares the sampled mv-oxygen signal of the control probe to the sampled mv-oxygen signal of the standby probe. The comparison identifies which probe has the higher mv-oxygen signal. The processing system 52(1) selects the control probe based upon this comparison. The processing system 52(1) maintains this selection, until another comparison is made at the end of the next successive sample period.

The operator can use the interface 60 of the CPU 54 to input and alter the prescribed sample period. The sample period used can vary according to the accuracy desired, as well as other criteria that the particular heat treatment process imposes.

Preferable, it is believed that the sample period should be at least once every minute, to discount random, short-lived changes in probe performance or temperature and atmosphere conditions within the furnace. For most typical heat treating operations, it is believed that the there should be at least one sample period during about every 100 minutes of the treatment process. Selecting a sample period between about one and about 100 minutes assures that the system 52(1) is responsive enough to sense significant trends in probe performance over time.

One implementation samples the mv-oxygen signal for each probe instantaneously at the end of each sample period. The control output 76 generates a selection signal 78 that selects as the control probe for the next sample cycle the probe whose sampled mv-oxygen signal is larger.

In the illustrated embodiment, this selection of the control probe also automatically governs the selection of the thermocouple. The processing system 52(1) implements this selection at the end of each sample period, and then begins a new sample period.

Instead of sampling instantaneous mv-oxygen signals for each probe at the end of each sample period, the mv-oxygen signals for each probe can be continuously sampled and individually averaged. In this implementation, the processing system 52(1) compares the running average mv-oxygen signal of the control probe to the running average mv-oxygen signal of the standby probe. The comparison identifies which probe had the higher running average mv-oxygen signal over the sample period.

The running averaging process discounts the effect of sudden swings in the mv-signals that may not be directly related to probe performance, but instead may be more related to transient temperature/atmosphere conditions within the furnace 12. For example, a probe located closer to the door of the furnace 12 may respond faster and with a greater amplitude change to the door opening than a probe located further away from the door. Other data handling techniques that discount or ignore transient variations can also be used.

In the preferred implementation shown in FIG. 6A, the system 52(1) not only identifies the probe having the higher sampled mv-oxygen signal (whether an instantaneous signal or a running average signal) (designated P(High) in FIG. 6A), but also derives the magnitude of the difference between its sampled mv-oxygen signal and the sampled mv-oxygen signal of the other probe (designated P(Low) in FIG. 6A). The system 52(1) then compares the derived difference to a prescribed minimum threshold value (designated Thresh(Min) in FIG. 6A).

In this preferred implementation, the control output 76 switches probes, i.e., it selects the standby probe as the new control probe (thereby also switching thermocouples), only if the standby probe's sample mv-oxygen signal exceeds the control's probe's sampled mv-oxygen signal by an amount greater than the minimum threshold value Thresh(Min). In this way, the system 52(1) prevents switching between the probes and thermocouples based upon operationally insignificant variations between their sampled mv-oxygen signal values.

The operator can use the interface 60 of the CPU 54 to input and alter the minimum threshold value Thresh(Min). Thresh(Min) can vary according to the demands of the particular heat treatment process. The value of Thresh(Min) should be selected so that it is not too large (thereby causing inordinate step increases in signal input to the furnace atmosphere controller 32) or not too small (leading to an unnecessary frequency in switching back and forth between probes). A balance between these two considerations must be struck, keeping accuracy as the overall objective. Generally speaking, it is believed that a representative minimum threshold value Thresh(Min) for most applications should be less than about 5 mv.

The processing system 52(1) preferably displays on the interface 60 of the CPU 54 a running average of the mv-oxygen signals and mv-temperature signals during each sample cycle. The displays can appear in real time graphic form on the CRT, or as an output to an associated printer or conventional strip chart. The displays preferably plot the change of the running averages over time. Instantaneous mv-signal values can also be displayed graphically or on analog meters.

(b) The Diagnostic Outputs

The decline of mv-oxygen signal levels in a probe over time is a precursor of inaccurate performance and failure. The decline may be gradual, yet persistent over time. The decline may also be sudden and large.

The preferred implementation of the processing system 52(1) (shown in FIG. 6B) makes use of this observation in generating diagnostic outputs for the probes P1/P2. The diagnostic outputs alert the operator of a decline in probe performance, both of a gradual and of a sudden nature.

The system 52(1) additionally processes the sampled mv-oxygen signals obtained during each sample period to generate the diagnostic outputs 80. The system 52(1) compares the sampled mv-oxygen signals of the two probes. It then analyzes the nature of the differences, both instantaneously and over time.

In the preferred implementation, upon selecting a control probe, the processing system 52(1) begins to monitor the actual mv-oxygen signal difference ΔSignal(Actual) between the selected control probe and the standby probe as a function of time during the period the selected probe remains the control probe.

The processing system 52(1) derives an integrated signal difference value ΔSIGNAL(TIME), expressed in terms of mv·time unit, as follows:

$$\Delta\text{SIGNAL(TIME)} = \int_{TSWITCH}^{TSAMPLE} \Delta\text{Signal(Actual)}\,dt$$

TSWITCH is the time at which data sampling to obtain ΔSignal(Actual) begins. It is the time at which a given control probe becomes the standby probe.

TSAMPLE is a sample time parameter selected by the operator. TSAMPLE defines the length of the sampling window during which instantaneous mv-oxygen signal data is acquired to compute ΔSignal(Actual), and the instantaneous ΔSignal(Actual) values are continuously integrated to derive ΔSIGNAL(TIME).

At the same time, the processing system 52(1) compares the integrated diagnostic signal difference value ΔSIGNAL(TIME) to a predetermined threshold value ALERT. Whenever the integrated signal difference value ΔSIGNAL(TIME) exceeds the predetermined threshold value ALERT, the processing system 52(1) generates a diagnostic output 80.

The processing system 52(1) continues to integrate the instantaneous ΔSignal(Actual) values to derive ΔSIGNAL(TIME) for as long as a given standby probe remains the standby probe. If this time period extends beyond the initial period between TSWITCH and TSAMPLE, the processing system 52(1)advances the sample window TSAMPLE forward, continuously deriving a running integral of the instantaneous ΔSignal(Actual)values obtained during the preceding TSAMPLE interval. When the running integrated value ΔSIGNAL(TIME) derived during the advancing sample period exceeds the predetermined threshold value ALERT, the processing system 52(1) generates a diagnostic output 80.

In the illustrated and preferred embodiment, the operator can use the CPU input 60 to enter and adjust on-line the values for ALERT and TSAMPLE.

The values for ALERT and TSAMPLE selected depend upon the cycle time of the particular ongoing heat treating operations. If the heat treating operation has a relatively short cycle time, then lower values of ALERT and TSAMPLE should be selected, and vice versa. The values for ALERT and TSAMPLE selected also depend upon the degree of accuracy that a given heat treating operation demands and the certainty required in diagnosing pre-failure mode conditions. Lower values of ALERT and TSAMPLE are selected when the operator seeks to maintain tight control conditions. Higher values of ALERT and TSAMPLE are selected when the operator seeks greater certainty when diagnosing pre-failure mode conditions. Selecting intermediate values of ALERT and TSAMPLE aim to balance these criteria.

It is believed that representative lower values of ALERT and TSAMPLE are 5 mv·hour and 1 hour, respectively. It is believed that representative higher values of ALERT and TSAMPLE are 500 mv·hour and 24 hours, respectively. Intermediate values can be selected generally proportionally between these lower and higher values.

Figure 7:
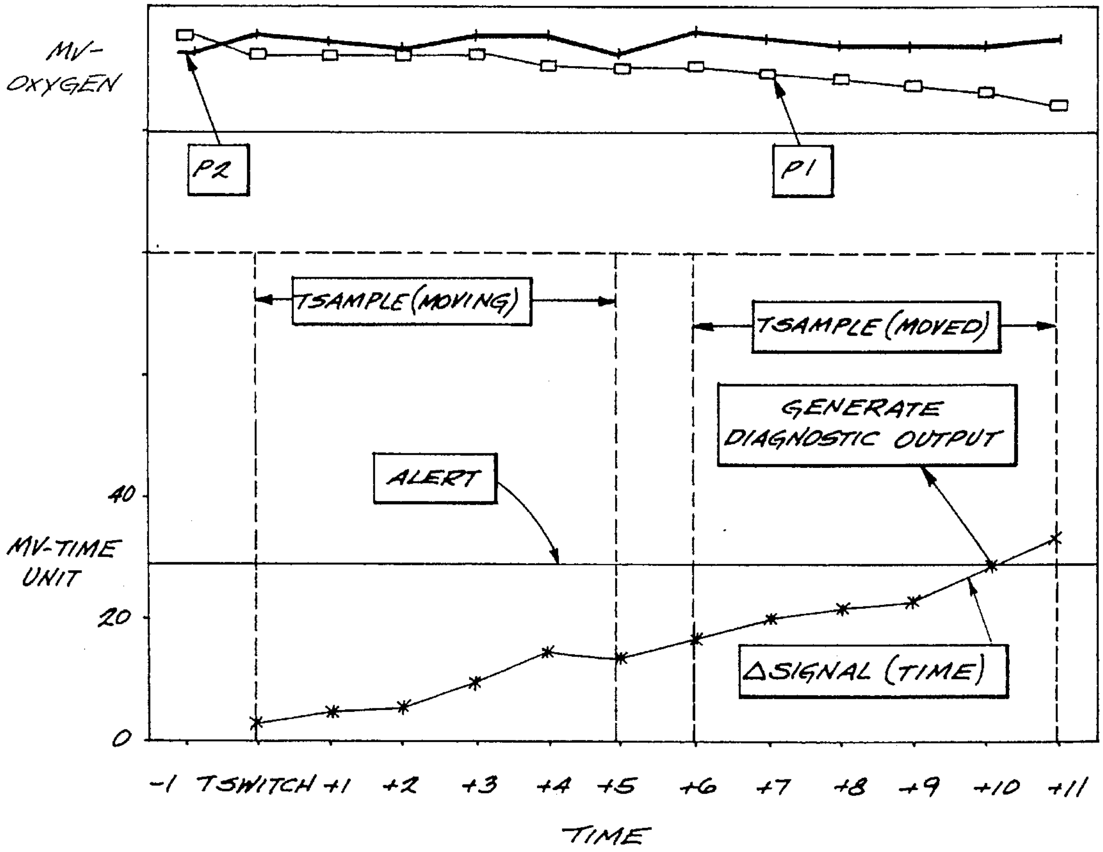
FIG. 7 is a graphical depiction of the generation of sensor diagnostic outputs in the preferred implementation shown in FIG. 6B.

FIG. 7 shows a representative operation of the processing system 52(1) in deriving the integrated value ΔSIGNAL(TIME). FIG. 7 shows P1 as the selected control probe and P2 as the standby probe at unit time TSWITCH−1. FIG. 7 shows the mv-oxygen signal for P1 dropping below the mv-oxygen signal for P2 at unit time TSWITCH, at which time P2 becomes the control probe and P1 becomes the standby probe. In FIG. 7, TSAMPLE is selected to be 5 time units, and ALERT is selected to be 30 mv·time unit.

As FIG. 7 shows, the lower mv-oxygen signals of P1 stabilize during unit time TSWITCH+1 to TSWITCH+4. The P1 signals begin to decline further at TSWITCH+5.

The processing system 52(1) integrates the instantaneous ΔSignal(Actual) values to derive ΔSIGNAL(TIME) from TSWITCH+1 to TSWITCH+5 (designated TSAMPLE(Moving) in FIG. 7). During this period, the integral ΔSIGNAL(TIME) increases, but remains below the ALERT value.

At TSWITCH+6, the P1 signals again stabilize, but begin to decline again at TSWITCH+7. The processing system 52(1)advances the sample window TSAMPLE forward, continuously deriving a running integral of the instantaneous ΔSignal(Actual)values obtained during the preceding TSAMPLE interval. At time TSWITCH+6, the running integral is based upon the instantaneous ΔSignal(Actual)values at time units TSWITCH+1 to TSWITCH+6. At time TSWITCH+7, the running integral is based upon the instantaneous ΔSignal(Actual)values at time units TSWITCH+2 to TSWITCH+7, and so on. The running integral ΔSIGNAL(TIME) at TSWITCH+6; +7; +8; + 9; and +10 remains below ALERT value.

The processing system 52(1) advances the sample window TSAMPLE forward (as TSAMPLE(Moved) in FIG. 7 shows), continuously deriving a running integral of the instantaneous ΔSignal(Actual) values within the advancing 5 time unit window. At time unit TSWITCH+11, the running integrated value ΔSIGNAL(TIME) exceeds the ALERT value. At TSWITCH+11, the processing system 52(1) generates the diagnostic output 80.

The diagnostic output 80 issues the alert signal 82. The alert signal 82 preferably triggers an alarm or other prompt to notify the operator that the current standby probe P1 is experiencing performance problems and should be replaced.

The diagnostic output 80 also generates the lock-out signal 84. The lock-out signal 84 overrides the switch element 53, maintaining its position to select the then-current control probe P1, regardless of subsequent control output 76.

Once a diagnostic output 80 is generated, the processing system 52(1) maintains the alert and lock-out conditions, until the operator resets the system 52(1).

It should be appreciated that the running integral method described above and shown in FIG. 7 is equivalent to taking a running average of the ΔSignal(Actual) values within the advancing sample window (defined by TSAMPLE) at less frequent time intervals. For example, instead of integrating continuously throughout the sample window, a running average can be derived once every prescribed time unit or multiple time units within the sample window.

The running average of ΔSignal(Actual) is expressed in terms of mv. Based upon the same criteria expressed above for the integrated value ΔSIGNAL(TIME), a representative range for a running average of ΔSignal(Actual) is about 5 mv (for TSAMPLE=1 hour) to about 20 mv (for TSAMPLE=24 hours). The running average can be derived, for example, once every minute for lower values of TSAMPLE, and a greater intervals for higher values of TSAMPLE.

In another implementation (see FIG. 6C), the processing system 52(1) detects the persistence of an absolute difference in ΔSignal(Actual) over time. If, the actual signal difference ΔSignal(Real) between the two probes exceeds a predetermined threshold signal difference ΔSignal(Alert), the processing system 52(1) starts a timer. The timer measures the length of time (ΔTIME) that this difference condition exists uninterrupted. When the ΔTIME exceeds a predetermined time value ΔTime(Alert), the processing system 52(1) generates a diagnostic output 80. The diagnostic output 80 generates the alert signal 82 and the lock-out signal 84 in the manner already described.

Should the difference condition cease, the processing system 52(1) resets the timer. The timer begins against when the difference condition reappears.

This implementation senses the persistence of relatively low level differences between the control probe and the standby probe. The persistence of these low level differences over time suggests that the standby probe is not operating reliably.

As in the selection for ALERT and TSAMPLE, the values selected for ΔSignal(Alert)and ΔTime (Alert) depend upon the degree of accuracy that a given heat treating operation demands and the certainty required of diagnosing pre-failure mode conditions. Typical values of ΔTime (Alert) are believed to lie in the range of about 2 hours to 20 hours. Typical values of ΔSignal(Alert) are believed to lie in the range of 5 mv (at higher values of ΔTime (Alert)) to about 20 mv (at lower values of ΔTime (Alert)). Lower relative values of ΔTime(Alert) and ΔSignal(Alert) are selected when the operator seeks to maintain tight control conditions. Higher relative values of ΔTime(Alert) and ΔSignal(Alert) are selected when the operator seeks greater certainty when diagnosing pre-failure mode conditions. Selecting intermediate values of ΔTime(Alert) and ΔSignal(Alert) aims to balance these criteria.

Figure 8:
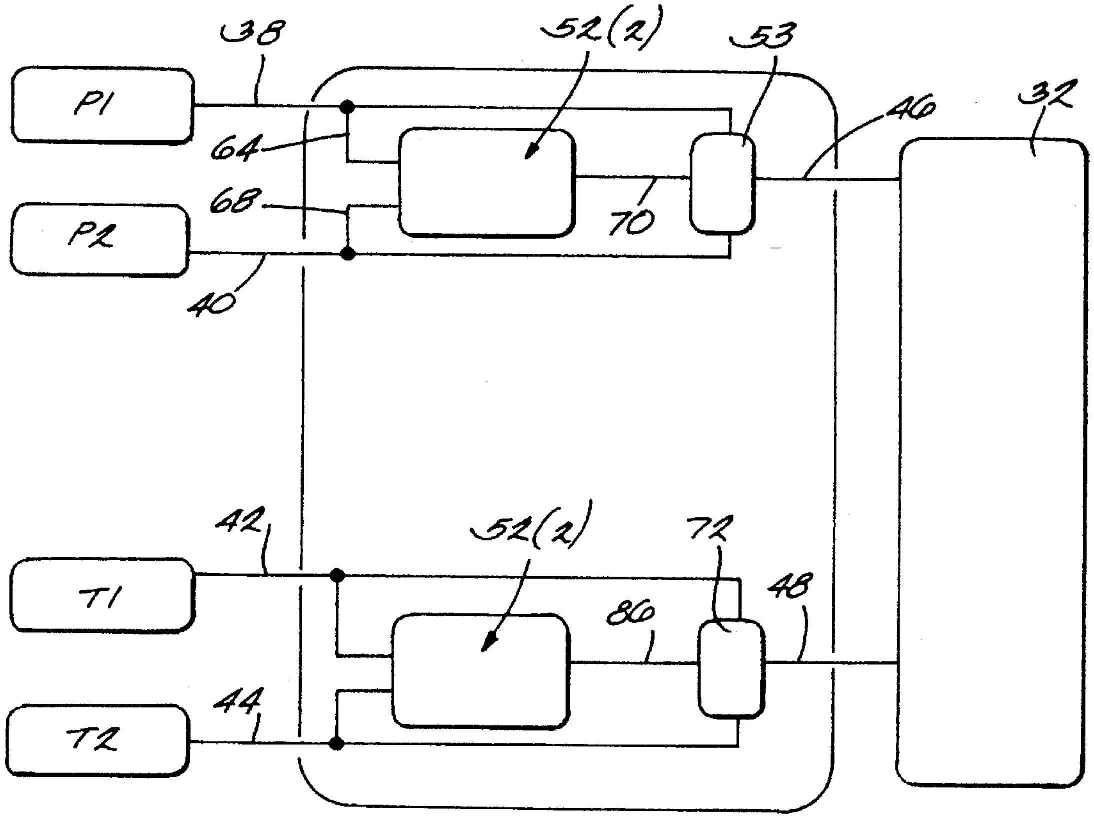
FIG. 8 is a schematic view showing an alternative implementation of a processing system for the interface module that embodies the features of the invention.
Figure 9:
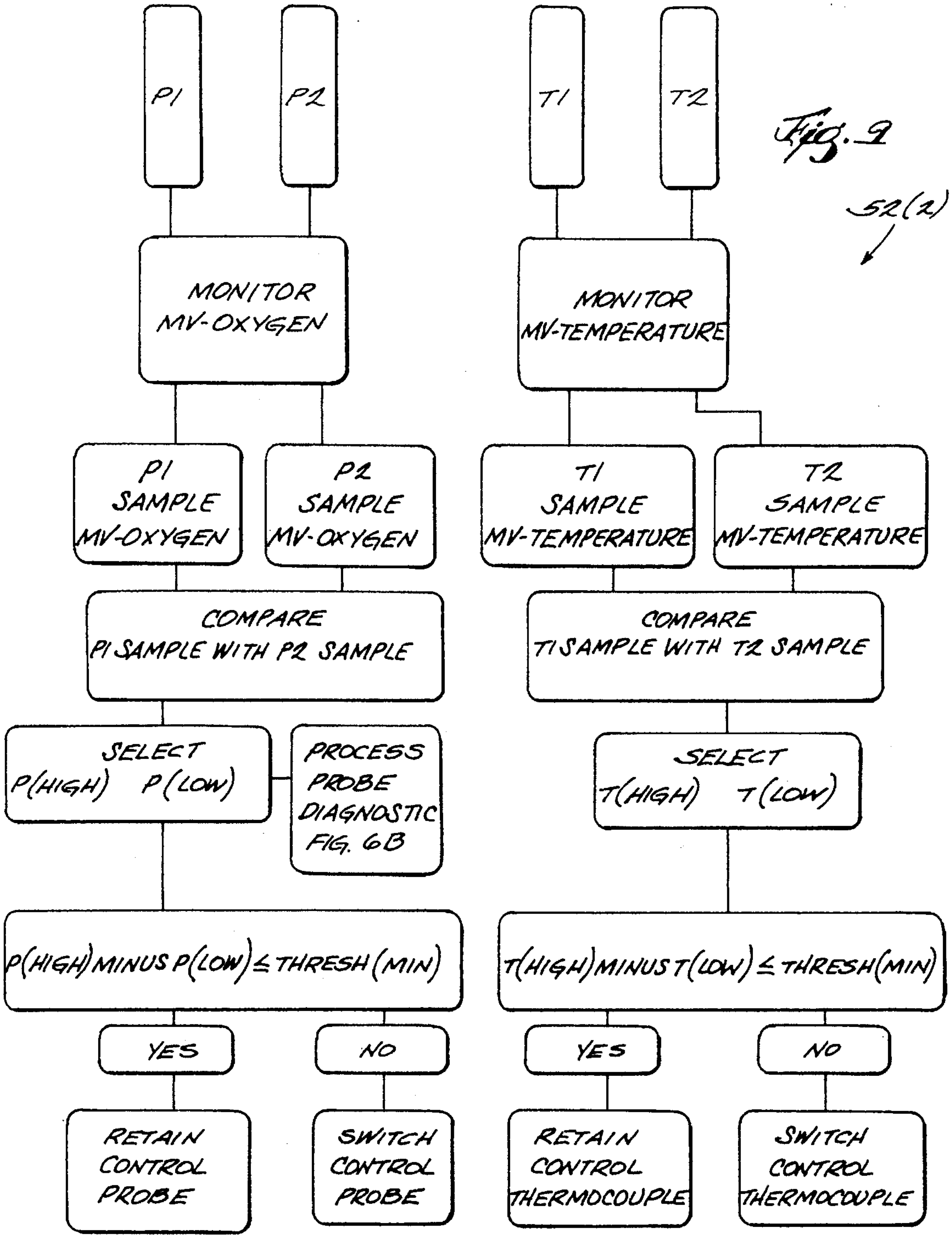
FIG. 9 is a flow chart showing the generation of sensor control outputs in the alternative implementation shown in FIG. 8.

In an alternative implementation, the processing system 52 can analyze and select the mv-oxygen and mv-temperature signals independently. FIGS. 8 and 9 show one representative alternative implementation.

Like the system 52(1) shown in FIG. 4, the system 52(2) in FIG. 8 generates probe control outputs 76 to operate the switch 53 and select the control probe as required to sustain higher mv-oxygen signal levels over the heat treatment cycle.

In FIG. 8, unlike FIG. 4, the system 52(2) also independently generates a thermocouple control output 86 to operate the switch 72 and select the thermocouple T1 or T2 to sustain higher mv-temperature signal levels.

The selection criteria that system 52(2) uses is that the higher mv-temperature signal will, over time, be the most accurate signal. However, if empirical performance data for the thermocouple used demonstrates a different correlation between performance and accuracy, a different selection criteria consistent with this empirical data should be used to obtain the full benefits of the invention.

In FIG. 8, then, the system 52(2) generates independent probe control outputs 76 and thermocouple control outputs 86, making independent selections of the control probe and the control thermocouple based upon simultaneous, multiple input analyses.

In this embodiment (see FIG. 9) an initial selection is made at the beginning of a given heat treatment cycle of the control probe and the standby probe. An initial independent selection is also made for the control thermocouple and standby thermocouple. These selections are preferably based upon past performance data to begin the heat treatment procedure with an accurate control probe and control thermocouple.

During the heat treatment cycle, the control and standby probes and thermocouples are operated simultaneously to sample the atmosphere and temperature conditions within the furnace 12. Their inputs are simultaneously fed to the interface module 36 for analysis by the processing system 52(2). The processing system 52(2) passes the mv-oxygen input signals of the control probe and the my-temperature input signals of the control thermocouple to the furnace atmosphere controller 32.

The processing system 52(2) also samples the mv-oxygen input signals and the mv-temperature signals individually for both the control and standby probes and the control and standby thermocouples during predetermined sample periods. As before stated, the sampled signals can be instantaneous signals or a running averages.

The sampled mv-oxygen signals for each probe are compared to select the control probe, in the manner already described. The sampled mv-temperature signals for each thermocouple are compared in the same way to select the control thermocouple. The comparison identifies which probe and which thermocouple had the higher sampled signal.

In the preferred implementation, the system 52(2) further derives the magnitude of the differences between the sampled mv-temperature signals. The system 52(2) compares the derived differences of the thermocouples to another prescribed minimum threshold value.

In this implementation, as before explained, the probe control output 76 switches probes, i.e., it selects the standby probe as the new control probe, if the standby probe's sampled mv-oxygen signal at the end of the sample period exceeded the control's probe's sampled mv-oxygen signal by an amount greater than the minimum threshold value.

In this implementation, the selection of the control probe does not govern the selection of the control thermocouple. The thermocouple control output 86 switches thermocouples, i.e., it selects the standby thermocouple as the new control thermocouple, if the standby thermocouple's sampled mv-temperature signal at the end of the sample period exceeded the control thermocouple's sampled mv-oxygen signal by an amount greater than the minimum threshold value.

The processing system 52(2) implements this selection at the end of each sample cycle, and then begins a new sample cycle.

Figure 6B:
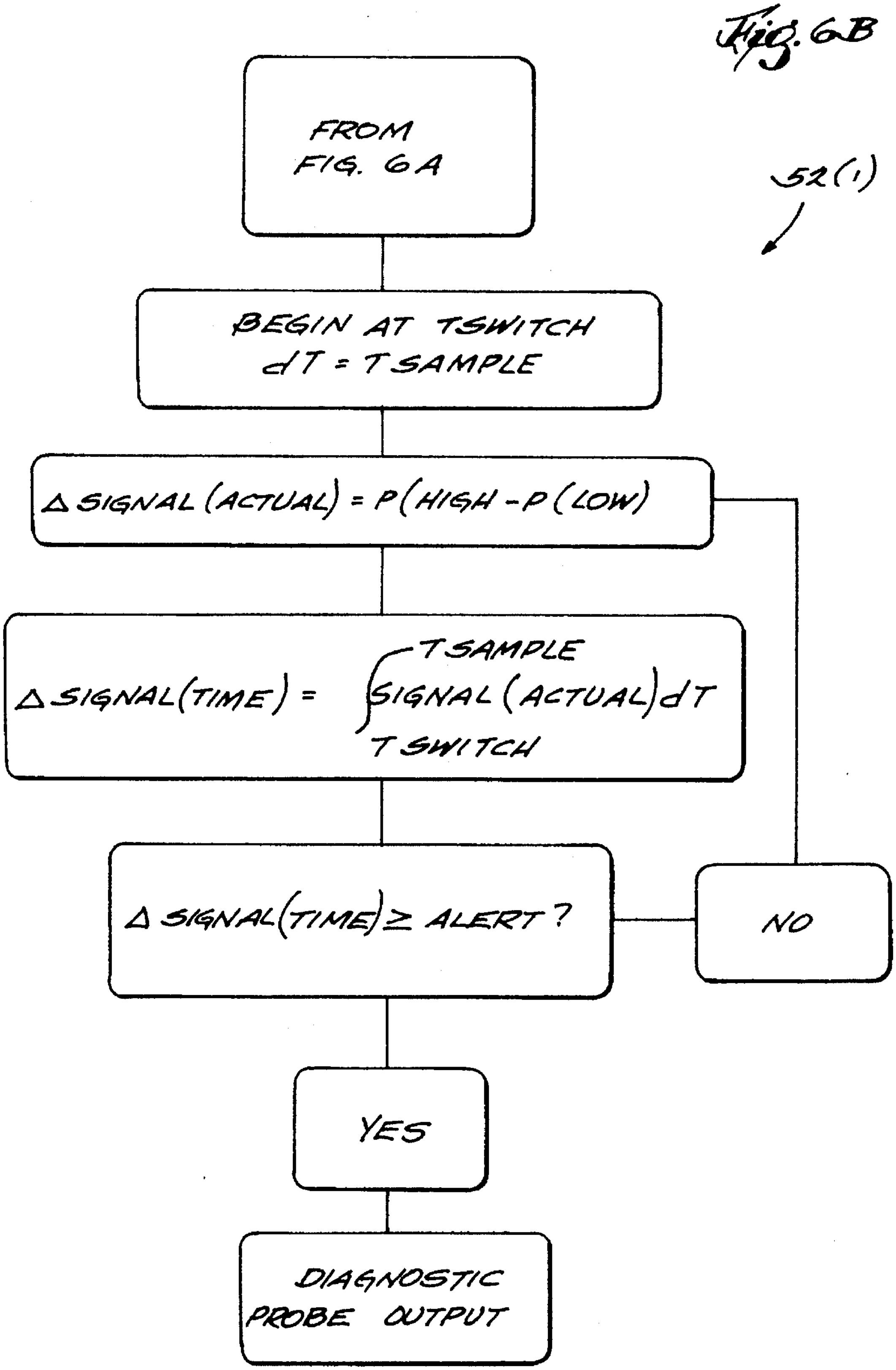
FIG. 6B is a flow chart showing the generation of sensor diagnostic outputs in a preferred implementation of an interface processing system that embodies the features of the invention.
Figure 6C:
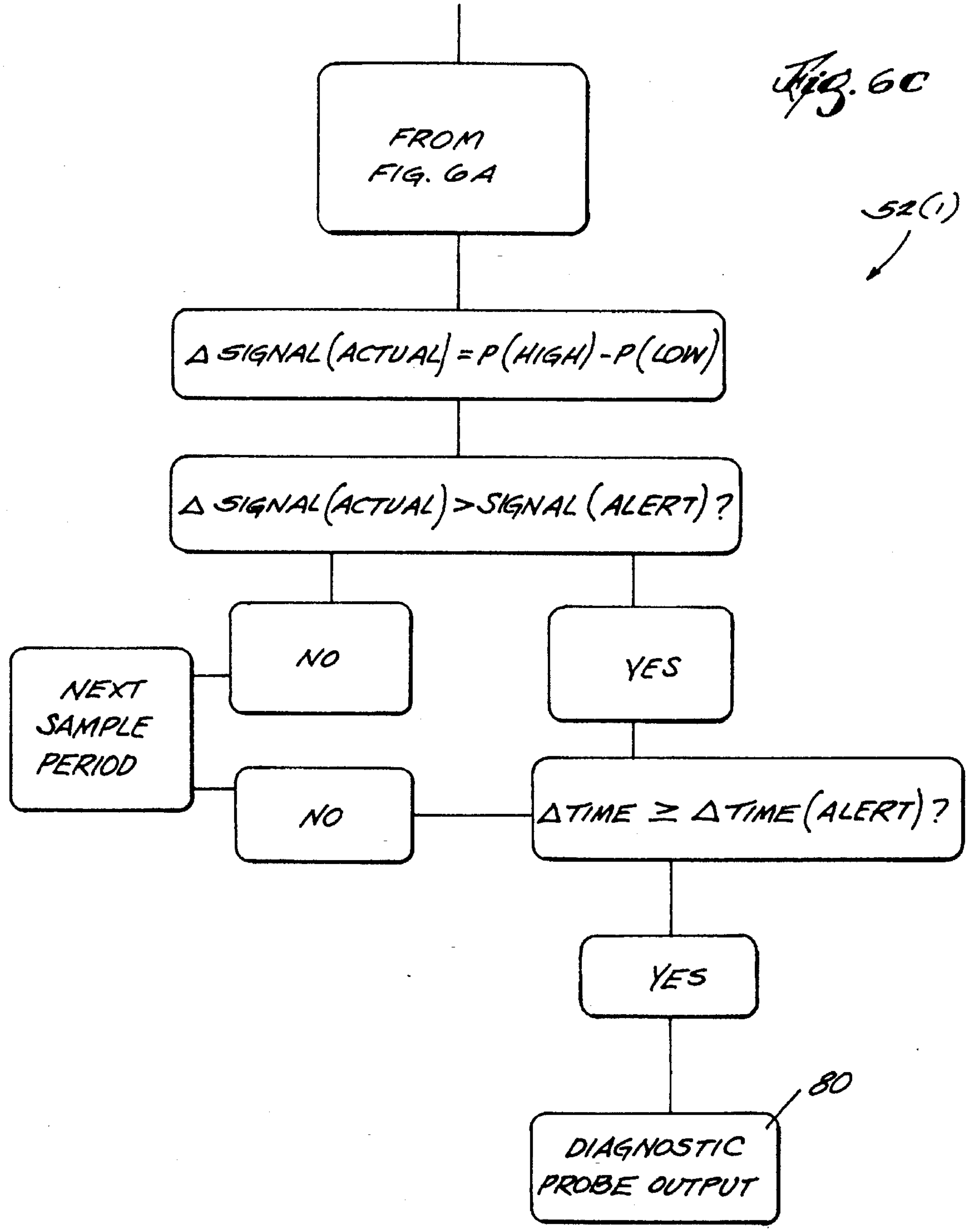
FIG. 6C is a flow chart showing the generation of sensor diagnostic outputs in an alternative implementation of an interface processing system that embodies the features of the invention.

In FIG. 9, the system 52(2) generates the diagnostic outputs for the probes in the same way shown in FIG. 6B, as previously described. Diagnostic outputs for the thermocouples can also be generated, based upon reliable correlations between trends in thermocouple performance and failure.

The processing system 52 that embodies the features of the invention thus serves not only as an automatic on-line selector for the probes P1/P2 and thermocouples T1/T2 (by generating the control outputs), but it also serves as an automatic on-line "early warning" device (by generating the diagnostic outputs). The processing system 52 generates the control outputs on-line to maximize accuracy of feedback input to the controller 32. The processing system 52 generates the diagnostic outputs on-line to warn of pre-failure degradation of probe P1/P2 and/or thermocouple T1/T2 performance, before ongoing heat treating operations are adversely affected. The automatic selection and diagnostic outputs can eliminate the need for periodic manual probe inspections.

It should be appreciated that the principles of the invention can be used to control the heat source 16, using mv-temperature signals from multiple thermocouples in the furnace 12. In this case, the selection criteria is based upon maintaining the most accurate thermocouple input signal to the furnace temperature controller 33.

The features of the invention are set forth in the following claims.

We claim:

1. A device that automatically controls selection of signal inputs from first and second probes positioned to simultaneously sense atmosphere having an oxygen content contained within a heat treating furnace, the device comprising an input element for electrical connection to the first and second probes to receive input signals independently from each probe relating to oxygen content of the furnace atmosphere, a processing element means electrically connected to the input element for comparing the received input signal from the first probe to the received input signal from the second probe and for selecting the first probe and not the second probe as a control probe when the comparison meets a first criteria and for selecting the second probe and not the first probe as a control probe when the comparison meets a second criteria different than the first criteria, and an output element electrically connected to the input element and responsive to the processing element to transmit as control outputs the received input signals from only the one selected control probe.

2. A device according to claim 1 wherein the received input signals each have magnitude, and wherein the processing element means includes comparison means for periodically comparing the magnitudes of the received input signals of each probe and selecting as the control probe the one probe having the input signal magnitude that is larger than the input signal magnitude of the other probe.

3. A device according to claim 2 wherein the comparison means is operative for deriving an average input signal magnitude of the received input signals of each probe over a time period and comparing the derived average input signal magnitudes to select as the control probe the one probe having the derived average input signal magnitude that is larger than the derived average input signal magnitude of the other probe during the time period.

4. A device according to claim 1 wherein the received input signals each have magnitude, and wherein the processing element means includes comparison means for periodically comparing the magnitudes of the received input signals and selecting as the control probe the one probe having the input signal magnitude that exceeds the input signal magnitude of the other probe by a set amount.

5. A device according to claim 4 wherein the comparison means is operative for deriving an average input signal magnitude of the received input signals of each probe over a time period and comparing the derived average input signal magnitudes to select as the control probe the one probe having the derived average input signal magnitude that exceeds the derived average input signal magnitude of the other probe by the set amount during the time period.

6. A device that monitors signal inputs from first and second probes positioned to simultaneously sense atmosphere contained within a heat treating furnace, the device comprising an input element for electrical connection to the probes to receive input signals independently from each probe related to the atmosphere contained within the furnace, and a processing element means electrically connected to the input element for comparing the received input signal from the first probe to the received input signal from the second probe and for generating a first diagnostic output for the first and not the second probe when the comparison fails to meet a first criteria and for generating a second diagnostic output for the second and not the first probe when the comparison fails to meet a second criteria different than the first criteria.

7. A device according to claim 6 wherein the received input signals each have magnitude, and wherein the processing element means includes comparison means for deriving a difference in the magnitudes of the received input signals by comparing the magnitude of the received input signal from the first probe with the magnitude of the received input signal from the second probe and for generating the first diagnostic output when the difference of the magnitudes over time fails to meet the first criteria and for generating the second diagnostic output when the difference of the magnitudes fails to meet the second criteria.

8. A device according to claim 7 wherein the comparison means is operative for deriving the difference of the magnitudes of the received input signals from the first and second probes during a time period and for generating the first or second diagnostic outputs when the difference of the magnitudes during the time period exceeds a set amount.

9. A device according to claim 8 wherein the comparison means is operative for integrating differences of the magnitudes over the time period to derive an integral of the differences and for generating the first or second diagnostic outputs when the integral of the differences exceeds a set amount.

10. A device according to claim 8 wherein the comparison means is operative for deriving a running average of the differences of the magnitudes over the time period and for generating the first or second diagnostic outputs when the running averages of the differences exceeds a set amount.

11. A device according to claim 6 wherein the received input signals each have magnitude, and wherein the first diagnostic output includes means for prompting an operator to replace the first probe when the magnitude of the received input signal of the first probe is smaller than the magnitude of the received input signal of the second probe, and wherein the second diagnostic output includes means for prompting the operator to replace the second probe when the magnitude of the received input signal of the second probe is smaller than the magnitude of the received input signal of the first probe.

12. A device according to claim 6 wherein the received input signals each have magnitude, and wherein the first diagnostic output includes means for locking-out the first probe when the magnitude of the received input signal of the first probe is smaller than the magnitude of the received input signal of the second probe, and wherein the second diagnostic output includes means for locking-out the second probe when the magnitude of the received input signal of the second probe is smaller than the magnitude of the received input signal of the first probe 13. A device that automatically controls selection of signal inputs from first and second probes positioned to simultaneously sense atmosphere contained within a heat treating furnace, the device comprising an input element for electrical connection to the probes to receive input signals independently from each probe related to the atmosphere contained within the furnace, a processing element means electrically connected to the input element for comparing the received input signal from the first probe to the received input signal from the second probe and for selecting one probe as a control probe and one probe as a standby probe based upon the comparison, an output element electrically connected to the input element and responsive to the processing element to transmit as control outputs the received input signals from only the one selected control probe, and the processing element means also serving, after selection of the control probe, to compare the received input signals of the selected standby probe and the selected control probe to generate a diagnostic output when the comparison fails to meet set criteria.

14. A device according to claim 13 wherein the received input signals each have magnitude, and wherein the processing element means includes comparison means for comparing the magnitudes of the received input signals from the standby probe and the control probe to derive a difference and for generating the diagnostic output when the difference fails to meet set criteria.

15. A device according to claim 13 wherein the received input signals each have magnitude, and wherein the processing element means includes comparison means for comparing the magnitudes of the received input signals from the standby probe during a time period to the magnitudes of the received input signals from the control probe during the time period to derive a difference and for generating the diagnostic output when the difference during the time period exceeds a set amount.

16. A device according to claim 15 wherein the processing element means includes means for integrating the difference over a time period to derive an integral and for generating the diagnostic output when the integral exceeds a set amount.

17. A device according to claim 15 wherein the processing element means includes means for deriving a running average of the difference over a time period and for generating the diagnostic output when the running average of the differences exceeds a set amount.

18. A device according to claim 13 wherein the diagnostic output includes means for prompting an operator to replace the selected standby probe.

19. A device according to claim 13 wherein the diagnostic output includes means for preventing subsequent selection of the standby probe as the control probe based upon the first comparison.

20. A heat treating system comprising a heat treating furnace, a source for generating heat treating atmosphere having an oxygen content and supplying the atmosphere to the furnace, multiple probes positioned to simultaneously sense the atmosphere supplied to the furnace, each probe independently generating an input signal having a magnitude which is related to the oxygen content of the atmosphere, an interface for controlling selection of the input signals from the multiple probes, the interface comprising an input element electrically coupled to the probes to receive input signals independently from each probe, a processing element means electrically connected to the input element for comparing the magnitude of the received input signals from each probe and for selecting one probe as a control probe based upon the comparison, and an output element electrically connected to the input element and responsive to the processing element to transmit as control outputs the received input signals from only the one selected control probe, and a controller electrically coupled to the source and to the interface for receiving the control outputs to create and maintain the atmosphere.

21. A system according to claim 20 wherein the processing element means includes means for comparing the received input signals from each probe to generate a diagnostic output when the comparison fails to meet set criteria.

22. A system according to claim 21 wherein the diagnostic output includes means for determining which input signal magnitude is least and for prompting an operator to replace the probe having the least input signal magnitude.

23. A system according to claim 21 wherein the diagnostic output includes means for determining which input signal magnitude is least and for locking-out the probe having the least input signal magnitude.

24. A system according to claim 20 wherein the processing element means includes means for periodically comparing the magnitudes of the received input signals of each probe to determine which magnitude is greatest and for selecting as the control probe the probe having the greatest input signal magnitude.

25. A heat treating system comprising a heat treating furnace, a source for generating heat treating atmosphere and supplying the atmosphere to the furnace, multiple probes positioned to simultaneously sense the atmosphere supplied to the furnace, each probe independently generating an input signal relating to the atmosphere, an interface for monitoring the input signals from the multiple probes, the interface comprising an input element electrically coupled to the probes to receive input signals independently from each probe, a processing element means electrically connected to the input element for comparing the received input signals from each probe and for generating a diagnostic output when the comparison fails to meet set criteria.

26. A system according to claim 25 wherein the received input signals of the probes have magnitude, wherein the diagnostic output includes means for determining which input signal magnitude is least and for prompting an operator to replace the probe having the least input signal magnitude.

27. A system according to claim 25 wherein the received input signals of the probes have magnitude, wherein the diagnostic output includes means for determining which input signal magnitude is least and for locking-out the probe having the least input signal magnitude.

28. A system according to claim 25 wherein the received input signals of the probes have magnitude, wherein the processing element means includes comparison means for comparing the magnitude of the received input signals from each probe and selecting one probe as a control probe based upon the comparison, and wherein the interface further includes an output element electrically connected to the input element and responsive to the processing element to transmit as control outputs the received input signals from only the one selected control probe, and further including a controller electrically coupled to the source and to the interface for receiving the control outputs to create and maintain the atmosphere.

29. A method for selecting signal inputs from at least two probes positioned to simultaneously sense atmosphere of a heat treating furnace, the atmosphere having oxygen content, the method comprising the steps of receiving input signals independently from each probe, the input signals having magnitude, the magnitude of the input signals being related to oxygen content of the atmosphere, periodically sampling the magnitudes of the received input signals from each probe, comparing the sampled magnitudes, selecting one of the probes as a control probe based, at least in part, upon the comparison of the sampled magnitudes, and transmitting as a control output the received input signals from only the one selected control probe.

30. A method for monitoring performance at least two probes positioned to simultaneously sense atmosphere of a heat treating furnace comprising the steps of receiving input signals independently from each probe, the input signals having magnitude, the input signals being related to the atmosphere in the furnace, periodically sampling the magnitudes of the received input signals from each probe while, performing a first comparison of the sampled magnitudes to select one of the probes as a control probe and one of the probes as a standby probe based, at least in part, upon the first comparison of the sampled magnitudes, and performing after the first comparison a second comparison of the sampled magnitudes to generate a diagnostic output when the second comparison fails to meet set criteria.

* * * * *